United States Patent
Cheng et al.

(10) Patent No.: US 7,091,614 B2
(45) Date of Patent: Aug. 15, 2006

(54) INTEGRATED CIRCUIT DESIGN FOR ROUTING AN ELECTRICAL CONNECTION

(75) Inventors: Chia-Lin Cheng, Tao-Yuan (TW); Ding-Dar Hu, Hsinchu (TW); Lee-Chung Lu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/982,634

(22) Filed: Nov. 5, 2004

(65) Prior Publication Data
US 2006/0097395 A1    May 11, 2006

(51) Int. Cl.
H01L 23/48    (2006.01)
H01L 27/10    (2006.01)

(52) U.S. Cl. ........................... 257/758; 257/211
(58) Field of Classification Search ............... None
See application file for complete search history.

(56) References Cited

U.S. PATENT DOCUMENTS

| | | | |
|---|---|---|---|
| 6,362,634 B1 * | 3/2002 | Jarvis et al. | 324/719 |
| 6,841,313 B1 | 1/2005 | Tsai et al. | |
| 2001/0040301 A1 * | 11/2001 | Miyako | 257/797 |
| 2002/0063335 A1 * | 5/2002 | Ozawa et al. | 257/758 |
| 2004/0044983 A1 * | 3/2004 | Dillon et al. | 716/21 |
| 2004/0262770 A1 * | 12/2004 | Ozawa | 257/758 |
| 2005/0110146 A1 | 5/2005 | Wang et al. | |

* cited by examiner

Primary Examiner—Evan Pert
Assistant Examiner—Benjamin P. Sandvik
(74) Attorney, Agent, or Firm—Duane Morris LLP

(57) ABSTRACT

An integrated circuit for routing of an electrical connection include a first metal layer having a first set of dummy conductive segments discretely arranged, and a second metal layer having a second set of dummy conductive segments discretely arranged. The segments of the first and second sets are interleaved with vertically overlapped areas for providing a predetermined link path between a selected first and a selected second nodes on two dummy conductive segments by selectively connecting a predetermined subset of the first and second dummy conductive segments through their vertically overlapped areas.

10 Claims, 6 Drawing Sheets

INTEGRATED CIRCUIT DESIGN FOR ROUTING AN ELECTRICAL CONNECTION

BACKGROUND

The present invention relates generally to an integrated circuit (IC) layout design, and more particularly to the implementation of interleaved dummy conductive segments to simplify a rerouting of electrical connections.

The designing and fabricating ICs have become more difficult, due to the increasingly smaller device size and more complicated circuit designs, as the semiconductor technology advances. The circuit complexity and device density often create design errors, such as electrical circuit errors, design rule violations, pattern congestion, timing errors, noise, crosstalk, etc. In order to correct these errors, a redesign of the IC is required by engineering change orders (ECOs). One typical ECO is to reroute the electrical connection from a first node to a second node of the IC. The electrical connection is often composed of a plurality of metal lines on various metal layers, and certain interconnection units interposed there among. A rerouting usually requires a change of at least three layers, two layers for the metal lines, and one layer for the interconnection units. From the fabrication point of view, each of the three layers requires a separate mask to define its patterns. This means that a change of design will necessitate a redesign of the three masks for the three layers. In some worse cases, a change of design often involves more than five masks. This incurs significant costs.

Therefore, desirable in the art of IC designs are new layouts and methods to simplify the process in rerouting of electrical connections.

SUMMARY

In view of the foregoing, this invention provides an IC and method for routing of an electrical connection. In one embodiment, the IC includes a first metal layer having a first set of dummy conductive segments discretely arranged, and a second metal layer having a second set of dummy conductive segments discretely arranged. The segments of the first and second sets are interleaved with vertically overlapped areas for providing a predetermined link path between a selected first and a selected second nodes on two dummy conductive segments by selectively connecting a predetermined subset of the first and second dummy conductive segments through their vertically overlapped areas.

Although the invention is illustrated and described herein as the embodiment, it is nevertheless not intended to be limited to the details shown, since various modifications and structural changes may be made therein without departing from the spirit of the invention and within the scope and range of equivalents of the claims.

DESCRIPTION

Figure 1:
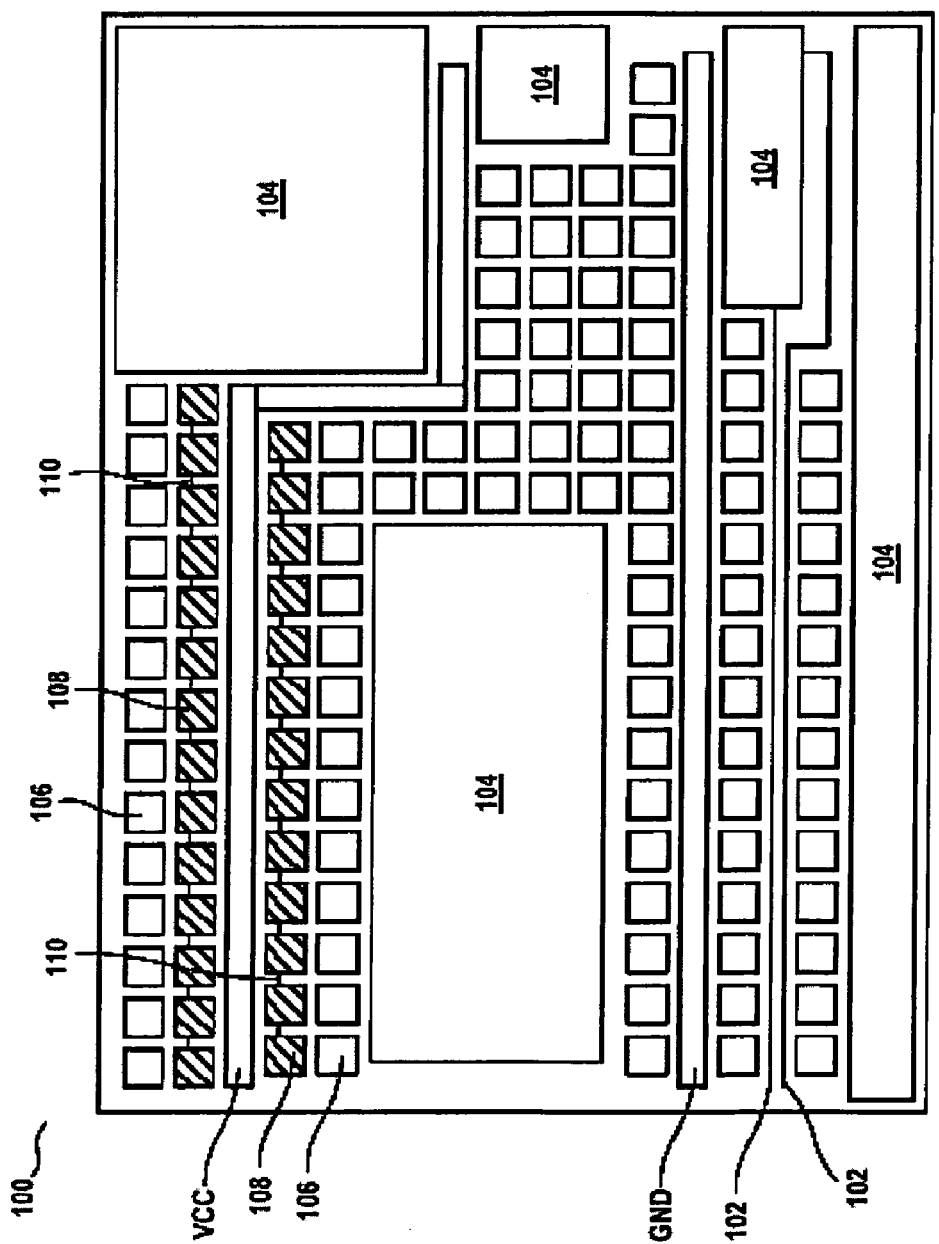
FIG. 1 illustrates a conventional IC layout.

FIG. 1 illustrates a conventional IC layout 100 with a dummy metal pattern. The IC layout 100 includes the IC's signal interconnecting lines 102, a VCC line, a GND line, and a plurality of internal circuits 104. In the IC layout 100, the dummy metal pattern is composed of a plurality of dummy metal pads 106 and 108 that occupy an unused area of a metal layer. The dummy metal pads help resolve IC fabrication and performance issues. For example, the dummy metal pads 106 and 108 are used for improving the uniformity of metal layer thickness. In a planarization process, the final thickness of a wire region is a function of the wire width, wire spacing, and metal density in that region. This results in variable interconnect sheet resistance and capacitance over the IC, and, therefore, variable parasitic delays. The utilization of the dummy metal pads greatly increases the metal layer thickness uniformity across the chip surface during the IC fabrication process. As another example, the dummy metal pads 106 and 108 are used to improve IC power system internal noise generation and static/dynamic IR drop issues. Each of the dummy metal pads 106 and 108 adjacent to the VCC or GND line are electrically connected together via conducting lines 110. The dummy metal pads 106 and 108 de-couple the undesired capacitance caused by the VCC or GND line to reduce the internal IC noise generation.

Figure 2:
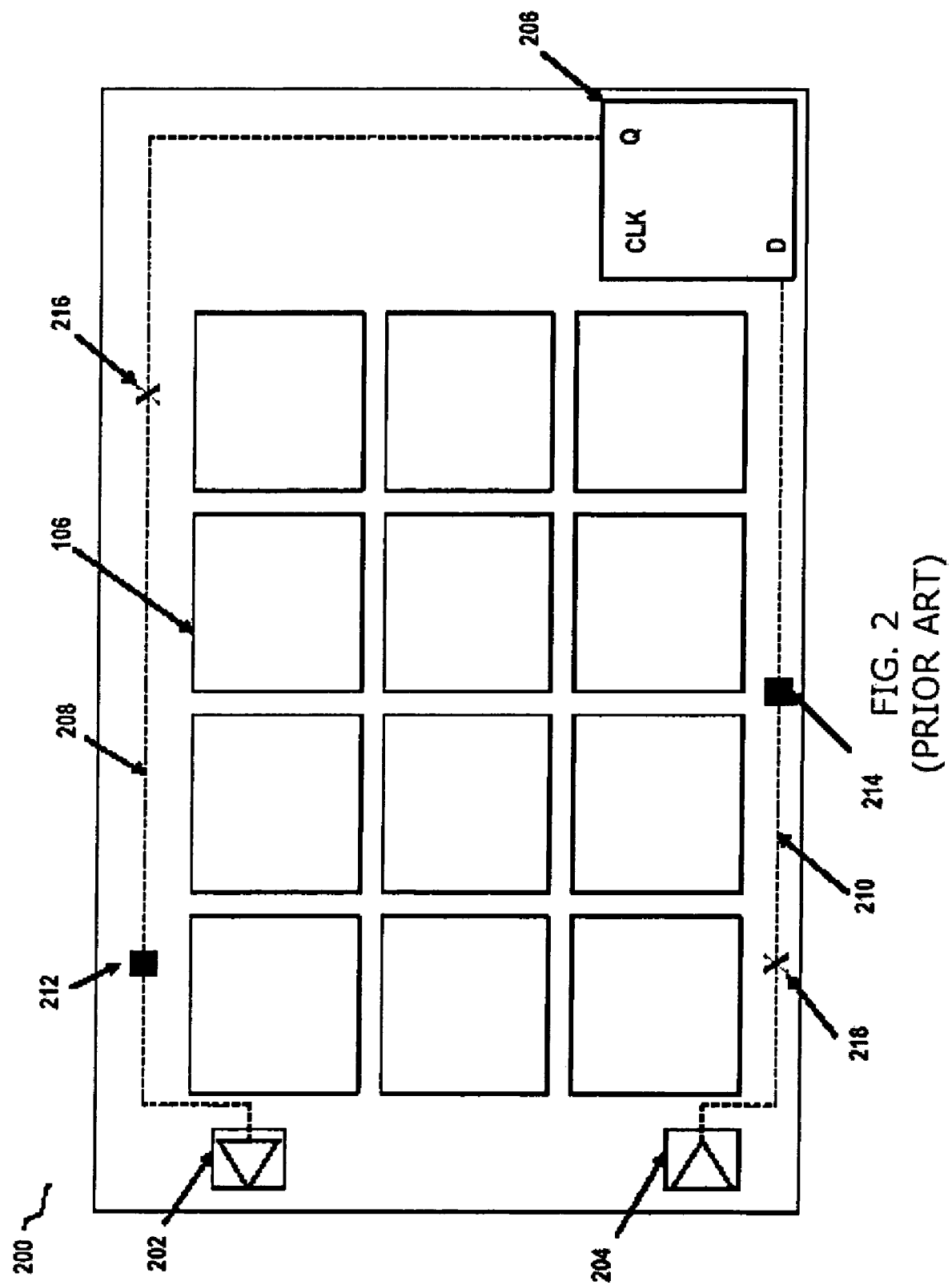
FIG. 2 illustrates when a rerouting of electrical connections is needed in a conventional IC layout.

FIG. 2 presents a conventional, simplified IC layout 200. Buffers 202 and 204 are connected to a D flip-flop 206 via interconnecting lines 208 and 210, respectively. In this conventional, simplified IC layout 200, the interconnecting line 208 connects to the buffer 202 input on a first metal layer, and transitions to a second metal layer by a via 212 for connection to the output node Q of the D flip-flop 206. The interconnecting line 210 connects to the buffer 204 output on the first metal layer and transitions to the second metal layer by a via 214 for connection to the input node D of the D flip-flop 206.

If a design error is found at a point 216 or 218 that requires rerouting of the interconnecting lines 208 and 210 (due to pattern congestion, rule violation, short condition, open condition, or design change for performance enhancement, etc.), the ECO would require multiple mask changes, e.g. the first metal layer mask, the second metal layer mask, and via mask, to implement the rerouting. This would be a costly and time-consuming endeavor. In some worse cases, the rerouting even requires more than five mask changes.

This invention discloses a scheme that replaces the conventional dummy conductive pads with a first set of dummy conductive segments on a first metal layer and a second set of dummy conductive segments on a second metal layer. The first and second sets of dummy conductive segments are arranged in an interleaved manner. An inter-level dielectric layer is interposed between the first metal layer and the second metal layer. A plurality of interconnection units are formed in the inter-level dielectric layer to selectively connect the first dummy conductive segments and the second dummy conductive segments, thereby forming a link path from a first node to a second node. When there is a change of design, the rerouting can be done by changing the arrangement of the interconnection units, without altering its underlying and overlying dummy conductive segments. This keeps the number of masks need to be changed to the minimum, and simplifies the rerouting process.

Figure 3A:
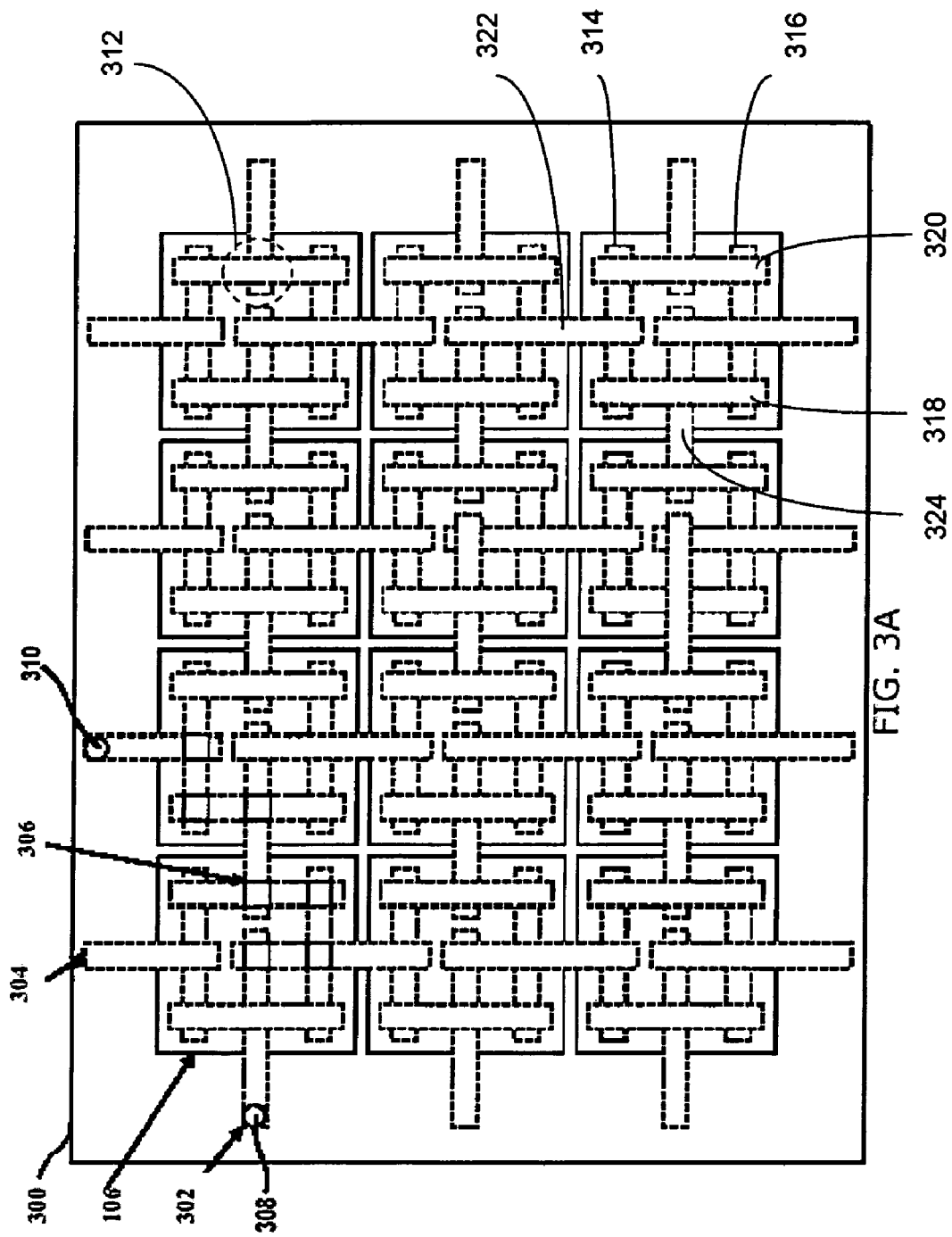
FIG. 3A illustrates an IC layout composed of interleaved dummy conductive segments, in accordance with one embodiment of the present invention.

FIG. 3A illustrates an IC layout composed of interleaved dummy conductive segments, in accordance with one embodiment of the present invention. A first metal layer, on which a first set of dummy conductive segments 302 are discretely arranged, is disposed above a semiconductor substrate 300. A second metal layer, on which a second set of dummy conductive segments 304 are also discretely arranged, is disposed above the first metal layer. The first set of the dummy conductive segments 302 and the second set of the dummy conductive segments 304 are placed in areas that could have been occupied by dummy metal pads 106. The discrete arrangement of the segments makes sure that each of the dummy conductive segments 302 and 304 is not in continuity one another that is placed on the same metal layer. However, the first set of the dummy conductive segments 302 and the second set of the dummy conductive segments 304 have a plurality of vertically (perpendicular to the drawing sheet) overlapped areas 312. These areas can help to make a link path between two node on any two dummy conductive segments. For example, a subset of the dummy conductive segments 302 and 304 can be selectively connected at their vertically overlapped areas to form a link path between a first node 308 and a second node 310.

An inter-level dielectric layer, capable of having one or more interconnection units 306 thereon, is interposed between the first metal layer and the second metal layer. The interconnection units 306 are used to connect the overlapped areas of a selected subset of the dummy conductive segments from both the first and second metal layers, thereby forming a link path. In this embodiment, initially, the first and second sets of dummy conductive segments 302 and 304 are passive in a way as they do not connect to any active node. When a rerouting is ordered, an original link between two node may be abandoned, and a new link path can be constructed by using these dummy conductive segments. By selectively arranging the interconnection units 306 in the inter-level dielectric layer, the first dummy conductive segments 302, the interconnection units 306, and the second dummy conductive segments 304 are able to form a link path connecting, for example, the first node 308 to the second node 310. This allows the rerouting to be done in a way without changing the layouts of the first and second metal layers.

The first set of dummy conductive segments 302 and the second set of dummy conductive segments 304 are arranged as a set of repetitive pattern units. Each unit can be of a polygonal shape to be placed with one another. Thus, the repetitive pattern may extend indefinitely in different directions in a large area. In this embodiment, the repetitive pattern unit is in a rectangular shape that includes two horizontal dummy conductive segments 314 and 316 of the first set, and two vertical dummy conductive segments 318 and 320 of the second set. The horizontal dummy conductive segments 314 and 316 vertically (perpendicular to the drawing sheet) overlap both the vertical dummy conductive segments 318 and 320. Similarly, the vertical dummy conductive segments 318 and 320 vertically (perpendicular to the drawing sheet) overlap both the horizontal dummy conductive segments 314 and 316.

Each repetitive pattern unit further includes one or more dummy conductive extension segments 322 and 324 extending beyond a boundary of the polygonal shape for connecting the repetitive pattern unit to its neighboring unit. The dummy conductive extension segment 324 is disposed between the two horizontal dummy conductive segments 314 and 316 on the same metal layer, and extends beyond the terminal ends of the two. Similarly, the dummy conductive extension segment 322 is disposed between the two vertical dummy conductive segments 318 and 320 on the same metal layer, and extends beyond the terminal ends of the two. The dummy conductive extension segments 322 and 324 connect neighboring repetitive pattern units, such that various link paths can be selectively constructed from one unit to another.

Figure 3B:
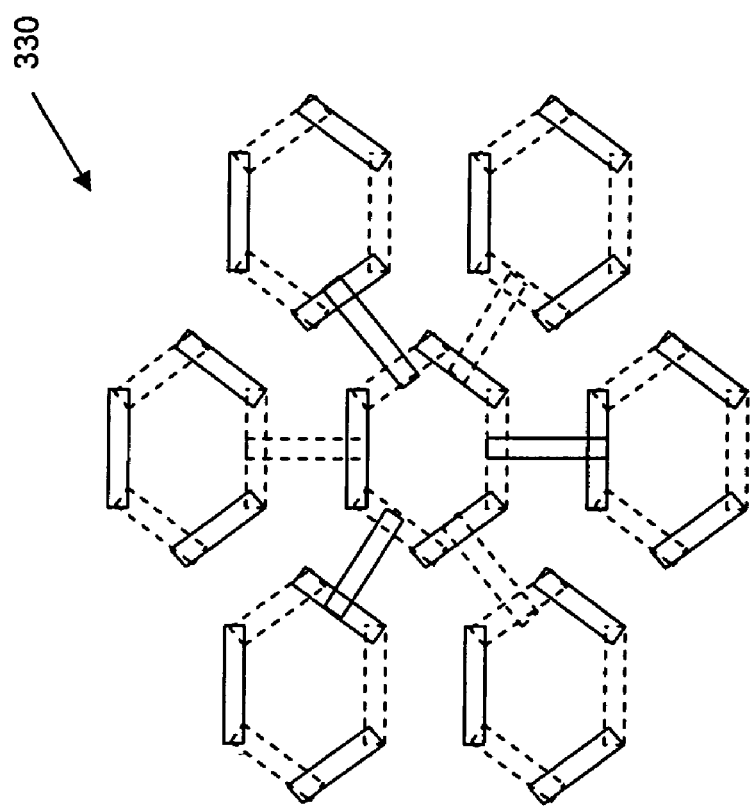
FIG. 3B illustrates an alternative pattern of the interleaved dummy conductive segments, in accordance with another embodiment of the present invention.

FIG. 3B illustrate an alternative repetitive pattern unit 330 made up of the dummy conductive segments on two metal layer. The repetitive pattern unit 330 is of a hexagonal shape, having a dummy conductive extension segment at each side for connecting to the neighboring units. In this alternative embodiment, any neighboring segments are on different metal layers, so that three discrete segments and three dummy conductive extension segments are formed on one metal layer, and the other three discrete segments and three dummy conductive extension segments are formed on another metal layer. It is noted that other kinds of polygons, such triangle and octagon, can also be used as the basis of the repetitive pattern units. It is also noted that, in a more complicated case, the dummy conductive segments can be arranged on more than two metal layers.

Figure 4:
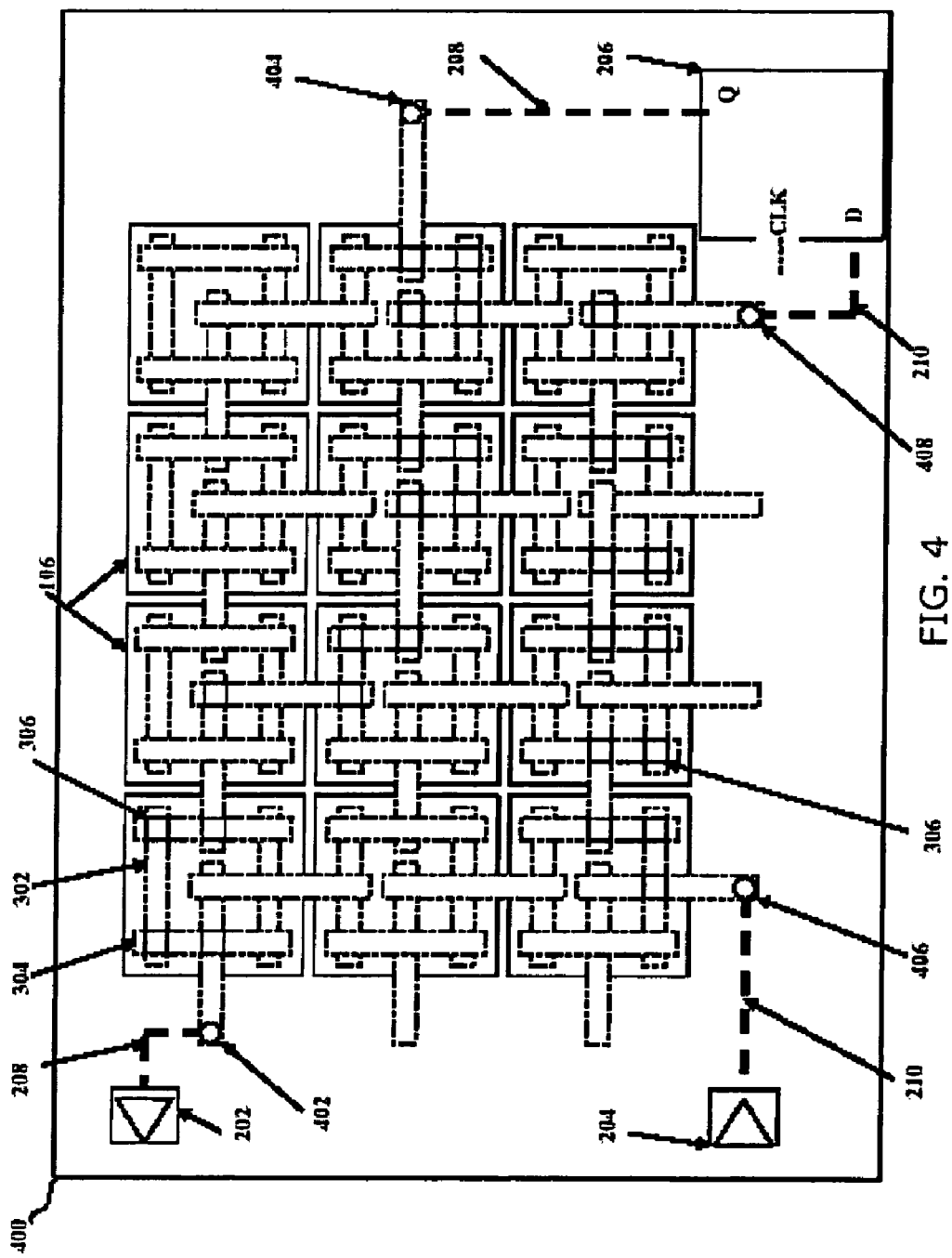
FIG. 4 illustrates utilization of the IC layout to correct design errors, in accordance with one embodiment of the present invention.

FIG. 4 illustrates an IC layout 400 utilizing the interleaved dummy conductive segments to correct design errors in an IC design, in accordance with one embodiment of the present invention. The IC layout 400 allows rerouting of interconnecting lines without changing the first metal layer and second metal layer masks.

With reference to both FIGS. 2 and 4, the interconnecting lines between the buffer 202 and node Q, as well as the interconnecting lines between the buffer 204 and node D, need to be rerouted. The buffer 202 input, which connects through the interconnecting line 208, is connected to the interleaved metal pattern at a first node 402. The line is rerouted as shown from one dummy conductive segment to the next conductive segment by interconnection units 306 placed (fabricated) at the intersections of the segments to a second node 404. The output node Q of the D flip-flop 206 is then connected to the second node 404 via the interconnecting line 208 to complete this signal routing change.

Also, the buffer 204 output, which connects through the interconnecting line 210, is connected to the interleaved dummy conductive segments at a third node 406. The line is rerouted as shown from one dummy conductive segment to the next dummy conductive segment by interconnection units 306 placed at the intersections of the segments to a fourth node 408. The input node D of the D flip-flop 206 is then connected to the fourth node 408 via the interconnecting line 210 to complete this signal routing change.

Figure 5:
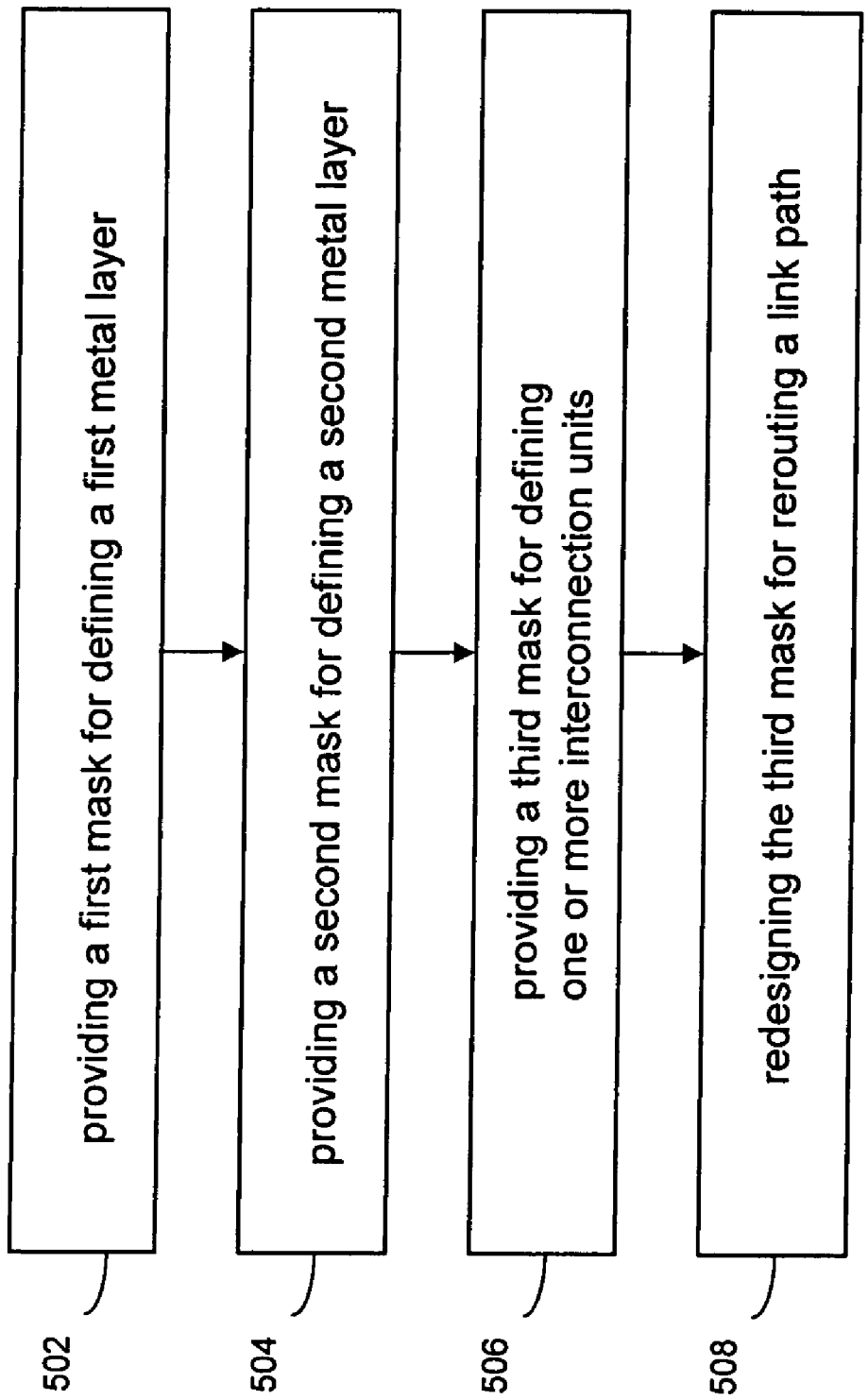
FIG. 5 is a flow chart showing the process of routing an electrical connection by using the interleaved dummy conductive segments, in accordance with one embodiment of the present invention.

FIG. 5 is a flowchart showing a method for rerouting an electrical connection between two nodes in an IC, by using the dummy conductive segments. In step 502, a first mask is provided to define a first metal layer having a first set of dummy conductive segments discretely arranged. In step 504, a second mask is provided to define a second metal layer having a second set of dummy conductive segments discretely arranged. The segments of the first and second sets are interleaved with vertically overlapped areas. In step 506, a third mask is provided to define one or more interconnection units to be interposed between the first and second metal layers. In step 508, when there is a need to reroute the electrical connection between the first node and the second node, the third mask is redesigned by rearranging the interconnection units to connect a predetermined subset of the first and second dummy conductive segments through their vertically overlapped areas to form a rerouted link path, without changing the first and second masks. This feature helps to simplify the process of rerouting an electrical connection between the first and second nodes, because only one mask, the third mask, needs to be redesigned.

Thus, the design changes identified in FIG. 2 that are incorporated by the at least three mask changes in the conventional layout are now incorporated by this interleaved dummy conductive segments embodiment with changes only to the interconnection unit mask, thereby providing both cost savings and design change turn time. The interleaved dummy conductive segments embodiment can reduce the number of necessary mask revisions by more than 50 percent. Moreover, since the dummy conductive segments only use the area that is conventionally occupied by square-shaped dummy metal pads 106, they occupy no extra layout area. In addition, the ECO redesign process can also be automated with software design tools. The dummy conductive segment insertion algorithm can be revised to fill the maximum number of dummy conductive segments to optimize the routing possibilities.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An integrated circuit using dummy conductive segments for routing an electrical connection, comprising:
   a first metal layer having a first set of dummy conductive segments discretely arranged;
   a second metal layer having a second set of dummy conductive segments discretely arranged,
   wherein the dummy conductive segments of the first and second sets are interleaved with vertically overlapped areas for providing at least one link path between a first node and a second node on any two dummy conductive segments by selectively connecting a predetermined subset of the first and second dummy conductive segments through their vertically overlapped areas and wherein the first and second dummy conductive segments are arranged as a set of repetitive pattern units, at least one of the repetitive pattern units comprising at least one dummy conductive extension segment extending beyond a boundary of the at least one repetitive pattern unit for connecting to the dummy conductive segment in a neighboring repetitive pattern unit.

2. The integrated circuit of claim 1 further comprising an inter-level dielectric layer interposed between the first metal layer and the second metal layer for separating the first dummy conductive segments from contacting the second dummy conductive segments.

3. The integrated circuit of claim 2 further comprising a selected set of interconnection units disposed in the inter-level dielectric layer for connecting the predetermined subset of the first and second dummy conductive segments through their vertically overlapped areas.

4. The integrated circuit of claim 1 wherein at least one of the repetitive pattern units is of a substantially polygonal shape.

5. The integrated circuit of claim 4 wherein the polygonal shape is a rectangle having two parallel dummy conductive segments on the first metal layer and two parallel dummy conductive segments.

6. The integrated circuit of claim 5 wherein the dummy conductive extension segment is disposed between the two parallel dummy conductive segments on the same metal layer, and extends beyond terminal ends of the same.

7. A dummy conductive segments section of an integrated circuit, comprising:
   a first metal layer having a first set of dummy conductive segments discretely arranged;
   a second metal layer having a second set of dummy conductive segments discretely arranged, wherein the first and second dummy conductive segments are interleaved with vertically overlapped areas; and
   an inter-level dielectric layer, interposed between the first metal layer and the second metal layer, having at least one interconnection unit for selectively connecting a predetermined subset of the first and second dummy conductive segments through their vertically overlapped areas to provide a predetermined link path between a first node and a second node on two dummy conductive segment,
   wherein the first and second dummy conductive segments are arranged as a set of repetitive pattern units and wherein at least one of the repetitive pattern units comprising at least one dummy conductive extension segment extending beyond a boundary of the at least one repetitive unit for connecting to the dummy conductive segment in a neighboring repetitive pattern unit.

8. The dummy conductive segments section of claim 7 wherein at least one of the repetitive pattern units is of a substantially polygonal shape.

9. The dummy conductive segments section of claim 8 wherein the polygonal shape is a rectangle having two parallel dummy conductive segments on the first metal layer and two parallel dummy conductive segments.

10. The dummy conductive segments section of claim 9 wherein the dummy conductive extension segment is disposed between the two parallel dummy conductive segments on the same metal layer, and extends beyond terminal ends of the same.

* * * * *